US009281599B2

(12) United States Patent
Lee

(10) Patent No.: US 9,281,599 B2
(45) Date of Patent: Mar. 8, 2016

(54) PORTABLE DEVICE

(75) Inventor: Dongho Lee, Seoul (KR)

(73) Assignee: LG Electronics Inc., Seoul (KR)

( * ) Notice: Subject to any disclaimer, the term of this patent is extended or adjusted under 35 U.S.C. 154(b) by 664 days.

(21) Appl. No.: 13/586,516

(22) Filed: Aug. 15, 2012

(65) Prior Publication Data

US 2013/0063908 A1 Mar. 14, 2013

(30) Foreign Application Priority Data

Sep. 8, 2011 (KR) ........................ 10-2011-0091099

(51) Int. Cl.
*H05K 5/00* (2006.01)
*H01R 13/405* (2006.01)
*H01R 12/72* (2011.01)
*H01R 43/16* (2006.01)
*H01R 43/18* (2006.01)

(52) U.S. Cl.
CPC ............ *H01R 13/405* (2013.01); *H01R 12/724* (2013.01); *H01R 43/16* (2013.01); *H01R 43/18* (2013.01); *Y10T 29/49208* (2015.01)

(58) Field of Classification Search
CPC ... H05K 3/301; H05K 5/0217; H05K 7/1427; H05K 7/142; G02F 2001/13332; G02F 2201/46; H02K 5/225; H02K 5/00
USPC ......... 361/752, 753, 759, 760, 791, 829, 825, 361/802, 796, 801
See application file for complete search history.

(56) References Cited

U.S. PATENT DOCUMENTS 6,542,381 B1 * 4/2003 Sei et al. ....................... 361/801

* cited by examiner

*Primary Examiner* — Robert J Hoffberg
*Assistant Examiner* — Hung Dang
(74) *Attorney, Agent, or Firm* — KED & Associates LLP

(57) ABSTRACT

The present invention relates to improving input/output port configuration and structure of the portable device. According to at least one of embodiments of the present invention, a portable device an input/output port having a frame fixed to a PCB to form a space for enabling a plug to be externally inputted therein, the frame including a top base forming a top surface of the frame, a pair of sidewalls configured by being bent from both sides of the top base to form both lateral sides of the frame, fixing terminals configured to be fixed to the PCB by being bent from both of the sides of the top base simultaneously with a pair of the sidewalls, a bottom base forming a bottom surface of the frame, and a front opening provided to a front side of the frame to have the plug inserted therein.

20 Claims, 8 Drawing Sheets

PORTABLE DEVICE

CROSS-REFERENCE TO RELATED APPLICATION(S)

Pursuant to 35 U.S.C. §119(a), this application claims the benefit of earlier filing date and right of priority to Korean Application No. 10-2011-0091099, filed on Sep. 8, 2011, the contents of which are hereby incorporated by reference herein in their entirety.

BACKGROUND

1. Field

The present invention relates to a portable device. Although the present invention is suitable for a wide scope of applications, it is particularly suitable for enhancing durability and reliance by improving input/output port configuration and structure of the portable device.

2. Background

Generally, a portable device means a device manufactured to facilitate portability of the portable device. And, the portable device may mean device capable of performing multiple functions including a phone, a computer, a camera, a PMP, an MP3 player and the like. Moreover, such a device as a mobile phone, a smart phone, a table PC, a smart pad and the like can be called a portable device as well.

A portable device has an input/output (hereinafter abbreviated I/O) port to be connected to an external device. In particular, the portable device has the I/O port for data connection or power supply. Recently, USB (universal serial bus) I/O port is widely used as the I/O port.

The USB I/O port is advantageous in performing power connection and data transmission/reception via one I/O port. Therefore, most of portable devices tend to be basically equipped with the USB I/O ports.

Although a standard USB port is provided as a USB I/O port, a micro-type USB port or a mini-type USB port, which has a relatively slim size, becomes popular to cope with a recent trend in slimming a portable device. Hence, a standard USB plug can be connected to a micro-type USB port using a gender as a medium.

An I/O port may consist of a frame installed inside a portable device to form a space for inserting a plug therein externally and a lead terminal provided within the frame. In this case, the lead terminal may be provided to a mold part. In this case, as a contact point with the plug in the lead terminal and a contact point with a PCB in the portable device are formed, the power connection or the data connection can be enabled.

FIG. 1 shows a structure that an I/O port is fixed in a portable device according to a related art. FIG. 2 and FIG. 3 show one example of an I/O port according to a related art.

Referring to FIG. 1, such a portable device as a mobile phone and a smart phone consists of a housing 1 configuring an exterior of the portable device, a PCB 2 provided within the housing 1, and an I/O port 10 fixed to the PCB 2.

Meanwhile, a plug (not shown in the drawing) is frequently put into or pulled out of the I/O port 10. In doing so, a force can be applied to a top direction (e.g., z-direction) or a bottom direction as well as an inserted direction (e.g., x-direction) of the plug. Likewise, a force may be applied in a lateral direction (e.g., y-direction) of the I/O port 10.

As mentioned in the foregoing description, since the lead terminal forms the contact point with the PCB, it is preferable that the I/O port 10 is solidly fixed in the z-direction. Therefore, referring to FIG. 1, an I/O port bracket 3 is used to cover a top side of the I/O port 10. In particular, the bracket 3 and the PCB 2 are coupled together to fix the I/O port 10 thereto. So to speak, the bracket 3 is used to reinforce the coupling force between the PCB 2 and the I/O port 10.

The bracket 3 and the PCB 2 can be coupled together via a coupling hole and a screw 4 or the bracket 3 and the housing 1 can be coupled together. Thus, the bracket 3 plays a role in solidly locking the I/O port 10 to the PCB 2 or the housing 1.

The above-described bracket may cause the following problems.

First of all, the number of function loaded in such a portable device as a smart phone keeps increasing. For instance, a phone function, a data communication function, a DMB function, a GPS function and the like are added to the portable device and various kinds of modules for the added functions are loaded in the portable device. Moreover, communication modules differ from each other in communication systems. Due to these reasons, if a device supports a plurality of communication systems, a plurality of communication modules should be correspondingly loaded in the device.

Moreover, each of the modules may include an antenna of its own. Yet, it is difficult to arrange the antennas appropriately due to spatial limitation of the portable device.

Meanwhile, since the bracket is formed of a metal based material, it may generate signal interference that triggers noise occurrence. This indicates that radio performance may be degraded.

Besides, a separate process for loading the bracket is required and the number of components of the portable device increases. Considering that portable devices are generally manufactured by mass production, such a problem as the increased number of components, complicated shapes of other components due to the increased number of components, additional production process and the like has considerable influence of the production cost increase. Therefore, it may be necessary to avoid the aforementioned bracket configuration.

Yet, the aforementioned bracket configuration 3 and 4 is required for the related art I/O port shown in FIG. 2 and FIG. 3. As mentioned in the foregoing description, this is because a support force against the z-directional force via the I/O port itself is not sufficient. This is attributed to the structural shape features of the related art I/O port. The corresponding explanation is described as follows.

Referring to FIG. 2 and FIG. 3, an I/O port 10 according to a related art consists of a frame 20 and a mold part 30. A front opening 23 is provided to a front side of the frame 20. And, a plug can be externally inserted via the front opening 23. The mold part 30 is provided within the frame 20 to play a role in connecting a plug and a PCB together. To this end, the mold part 30 includes a lead terminal 31.

Basically, the frame 20 can be formed by bending processing. Both sidewalls 25 are formed by bending with reference to a top base 24 and a bottom base 26 can be formed by bending.

Yet, referring to FIG. 2 and FIG. 3, a separate bending process is necessary to from fixing terminals 21 and 22. For instance, the front fixing terminal 21 is formed by bending one portion of the bottom base 26. And, the rear fixing terminal 22 is formed by bending one portion of the top base 24. Hence, the separate bending process causes a problem that the number of the steps of the process for manufacturing the frame 20 increases.

Moreover, since the front fixing terminal 21 is formed by bending one portion of the bottom base 26, the bending processing is not facilitated and a length and/or width of the front fixing terminal 21 is limited to a predetermined range. Likewise, since the rear fixing terminal 22 is formed by bending one portion of the top base 25 in rear direction, it may cause a problem that a quantity of material wasted for the rear fixing terminal 22 is considerable. Namely, it causes a problem that a quantity of scraps generated from the parental material increases.

Besides, the rear fixing terminal 22 receives a force in a bending direction with a plug is inserted or withdrawn. As the insertion and withdrawal of the plug are repeated, the rear fixing terminal 22 tends to further bended or to return to a state before the bending. Therefore, a loosened space may be generated from the rear fixing terminal 22, thereby reducing the fixing or coupling power of the frame 10.

Meanwhile, a prescribed force is applied to the mold part 300 when the plug is inserted or withdrawn. Hence, a notch 27 can be provided to the top frame 24 to reinforce the coupling power between the mold part 30 and the frame 10. And, a rib 28 can be provided to prevent the mold part 30 from being separated via a rear opening 29 of the frame 20.

However, the above-described structures fail to provide sufficient coupling power between the mold part 30 and the frame 20. And, since the coupling power between the mold part 30 and the PCB is not sufficient, it may cause such a problem as separation of the mold part 30, damage of a contact point between the mold part 30 and the PCB and the like.

Basically, in order to solve the aforementioned problems, the demand for an advanced I/O port is rising in the necessity of the reinforcement of the coupling power between the PCB and the mold part 30, the reinforcement of the coupling power between the frame 20 and the PCB, a simplified I/O port manufacturing process, a simplified portable device manufacturing process, a decreased number of portable device components, wireless communication function enhancement and the like.

SUMMARY OF THE INVENTION

Accordingly, the present invention is directed to a portable device and an I/O port thereof that substantially obviate one or more problems due to limitations and disadvantages of the related art.

An object of the present invention is to provide a portable device, by which such performance of the portable device as wireless communication performance and the like can be enhanced in a manner of omitting a bracket configuration.

Another object of the present invention is to provide a portable device and an I/O port thereof, by which the manufacture of the portable device and the I/O port thereof can be facilitated.

Another object of the present invention is to provide a portable device and an I/O port thereof, by which a manufacturing cost can be reduced in a manner of decreasing the number of components and simplifying the manufacturing process.

Another object of the present invention is to provide a portable device and an I/O port thereof, by which an economical portable device and an economical I/O port thereof can be provided in a manner of facilitating the manufacture of the I/O port and simplifying the manufacturing process.

Another object of the present invention is to provide an I/O port of a portable device with which a PCB can be coupled more solidly and reliably.

Another object of the present invention is to provide an I/O port and portable device having the same, by which reliability and durability can be enhanced in a manner of preventing transformation or damage caused to a mold part of the I/O port.

Another object of the present invention is to provide an I/O port and portable device having the same, by which an external force applied via a plug can be evenly distributed and by which the external force applied via the plug can be prevented from being directly delivered to a mold part of the I/O port to the maximum.

A further object of the present invention is to provide an I/O port and portable device having the same, by which a mold part can be solidly fixed to a PCB in a manner of increasing a soldering area between a lead terminal and the PCB and providing a mold part fixing terminal.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a portable device according to an embodiment of the present invention may include a housing, a PCB (printed circuit board) provided within the housing, and an input/output port having a frame fixed to the PCB to form a space for enabling a plug to be externally inputted therein, the frame including a top base, sidewalls, a bottom base and a fixing terminal configuring a portion of each of the sidewalls.

The top base may form a top surface of the frame and the top base may form a bottom surface of the frame. The sidewalls are formed at both lateral sides of the frame, respectively.

In this case, the fixing terminal may be formed at both sides of the top base simultaneously. In particular, the fixing terminal can be simultaneously formed together with the sidewalls.

The fixing terminal may be configured to extend under the top base by being vertically bent from the top base. And, two fixing terminals can be provided to each of both sides.

An embossing may be formed at the fixing terminal to extend a soldered surface. In this case, the embossing may be formed at each of the fixing terminals or at a specific one of the fixing terminals.

The input/output port may include a mold part provided within the frame by having a plurality of lead terminals built in one body. The mold part may be formed by insert molding. Alternatively, after a shape of the frame has been completely formed, the mold part may be formed by molding after inserting the frame and the lead terminals double, i.e., double insert molding.

A front opening may be formed at a front side of the frame to enable the plug to be inserted therein. An extension portion may be provided to the front opening to facilitate the plug to be inserted.

Preferably, a width of each of a plurality of the lead terminals gradually increases from a front side to a rear side. This is to extend an area on which soldering is performed. Likewise, a recess may be formed at a tip of a rear end of each of a plurality of the lead terminals. This is to extend an area on which soldering is performed as well. As mentioned in the following description, if a soldered area or surface is wide, it may mean that a coupling power between both parties is further raised.

A rear opening may be provided to a rear side of the frame and a fixing rib may be provided to the rear opening to fix the mold part by being loaded on a surface of the mold part.

Stoppers for sliding prevention of the mold part and an inserted distance restriction of the plug may be provided by a notching process to each of the top base and the bottom base. Of course, the stopper may be provided to either the top base or the bottom base. Yet, in order to distribute an external force via the plug and to prevent the mold part from being damaged, both top stoppers and bottom stopper may be preferably provided.

Mold part fixing terminals may be provided to both rear sides of the mold part, respectively, to be fixed to the PCB.

Preferably, the aforementioned frame may be fixed to the PCB directly via the fixing terminal only. In particular, such an auxiliary fixing means as a bracket is preferably excluded. Hence, the frame may preferably come in contact with an inner surface of the housing. To this end, a shape of the inner surface of the housing and a shape of the top frame should correspond to each other.

For instance, if a perforating hole is formed in the top frame, a protrusion or projection counter to the perforating hole may be preferably formed at the inner surface of the housing.

In another aspect of the present invention, a method of manufacturing a frame may be provided to configure an input/output port of a portable device and to form a space for having a plug inserted therein externally.

In particular, a method of manufacturing a frame, which configures an input/output port of a portable device and forms a space for having a plug inserted therein externally, according to an embodiment of the present invention may include a notching processing step of imprinting a top base, a bottom base, a pair of sidewalls and a part for forming a fixing terminal configuring a portion of a pair of the sidewalls to be fixed to a PCB (printed circuit board) on a parental material, a primary bending processing step of forming a pair of the sidewalls and the fixing terminal simultaneously by bending both sides of the top base, and a secondary bending processing step of forming the bottom base by bending one of a pair of the sidewalls or both of a pair of the sidewalls.

In the notching processing step, an embossing may be formed at the part for forming the fixing terminal.

Preferably, the method may further include a blanking processing step of producing a plurality of frames from the parental material and separating a plurality of the frames from each other.

Preferably, the method may further include a piercing processing step of forming a reference point of the frame in the parental material. And, the piercing processing step may be performed before the notching processing step.

In another aspect of the present invention, a method of manufacturing an input/output port for a portable device may be provided.

In particular, a method of manufacturing an input/output port for a portable device according to an embodiment of the present invention may include a notching processing step of imprinting a top base of the frame, a bottom base of the frame, a pair of sidewalls of the frame and a part of the frame for forming a fixing terminal configuring a portion of a pair of the sidewalls to be fixed to a PCB (printed circuit board) on a parental material, a primary bending processing step of forming a pair of the sidewalls and the fixing terminal simultaneously by bending both sides of the top base, a secondary bending processing step of forming the bottom base by bending one of a pair of the sidewalls or both of a pair of the sidewalls, and a coupling step of coupling the mold part within the frame.

In a further aspect of the present invention, a portable device according to an embodiment of the present invention may include a housing, a PCB (printed circuit board) provided within the housing, and an input/output port having a frame fixed to the PCB to form a space for enabling a plug to be externally inputted therein.

In this case, the frame may include a top base forming a top surface of the frame, a pair of sidewalls configuring both lateral sides of the frame, fixing terminals configured to fix the frame to the PCB, and a bottom base forming a bottom surface of the frame. In this case, the fixing terminals may be formed simultaneously by the bending processing for forming a pair of the sidewalls to configure most outer walls of the frame.

Each of the sidewalls may include a vertical sidewall configured vertical to the top frame and an inclining sidewall extending from the vertical sidewall by inclining inward.

The inclining sidewall may include a front inclining sidewall and a rear inclining sidewall, which are configured along a direction of inserting the plug by being spaced apart from each other in a prescribed distance.

In this case, the fixing terminal may include a center fixing terminal provided between the front inclining sidewall and the rear inclining sidewall. And, the fixing terminal may preferably include a rear fixing terminal provided to a most rear side of each of a pair of the sidewalls.

The center fixing terminal and the rear fixing terminal may configure the same plane in one side of the frame.

The input/output port may include a mold part provided within the frame by having a plurality of lead terminals built in one body.

The mold part may include a front mold part provided between the top frame and the bottom frame to form a contact point with the plug and a rear mold part provided to closely adhere to the top frame and the bottom frame to for a contact point with the PCB.

Stoppers for sliding prevention of the mold part and an inserted distance restriction of the plug may be provided to each of the top base and the bottom base in a manner of being situated in front of the rear mold part.

In this case, a distance between the stoppers formed on the top base may be preferably different from that between the stoppers formed on the bottom base.

The above-mentioned input/output port may be modified in various ways. For instance, the input/output port may include a micro-type USB input/output port.

It is to be understood that both the foregoing general description and the following detailed description of the present invention are exemplary and explanatory and are intended to provide further explanation of the invention as claimed.

BRIEF DESCRIPTION OF THE DRAWINGS

The embodiments will be described in detail with reference to the following drawings in which like reference numerals refer to like elements wherein.

DETAILED DESCRIPTION

In the following detailed description, reference is made to the accompanying drawing figures which form a part hereof, and which show by way of illustration specific embodiments of the invention. It is to be understood by those of ordinary skill in this technological field that other embodiments may be utilized, and structural, electrical, as well as procedural changes may be made without departing from the scope of the present invention. Wherever possible, the same reference numbers will be used throughout the drawings to refer to the same or similar parts.

In the following description, an I/O port according to the present invention and a portable device including the I/O port according to the present invention are explained in detail with reference to FIGS. 4 to 7.

Figure 8:
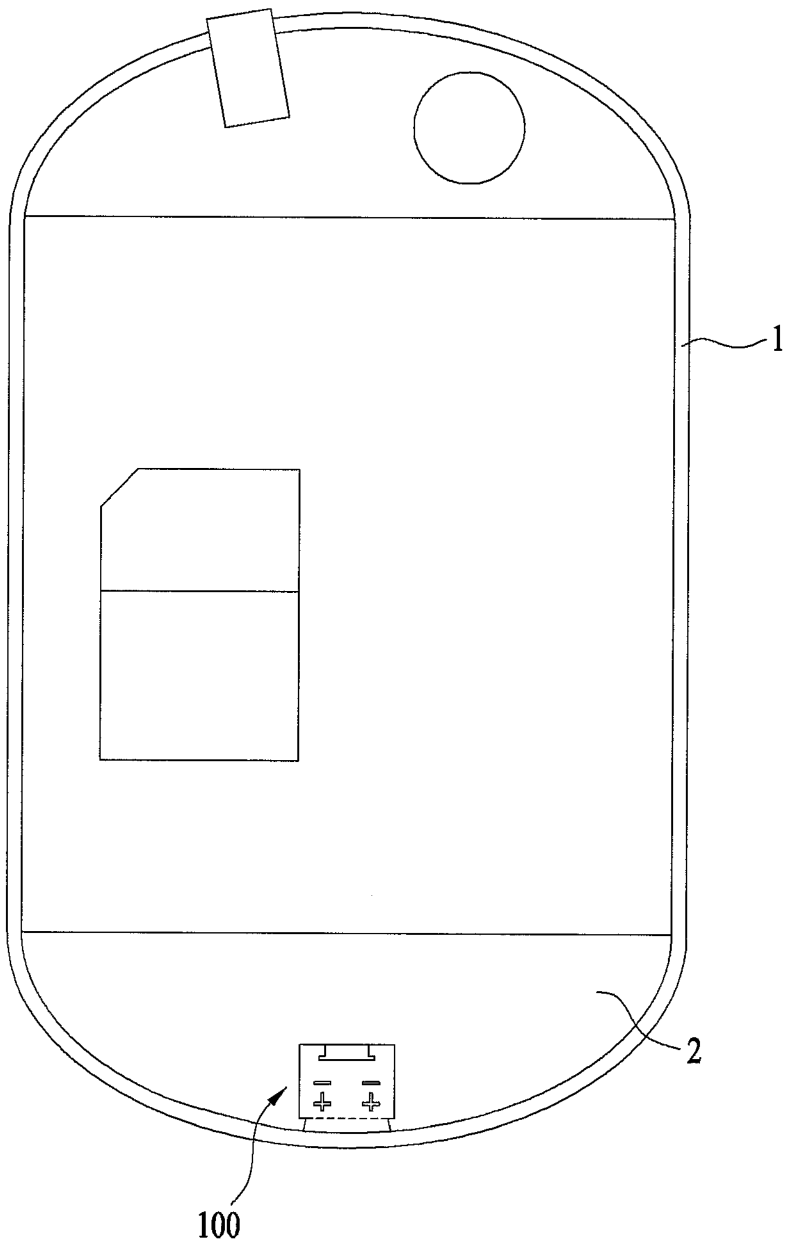
FIG. 8 shows a portable device according to one embodiment of the present invention.

Referring to FIG. 8, a portable device according to the present invention may include a housing, a PCB (printed circuit board) provided in the housing, and an I/O (input/output) port fixed to the PCB. And, the I/O port includes a frame to form a space into which a plug is inserted externally.

Referring to FIGS. 4 to 7, a frame 200 includes a top base 240. And, the top base 240 configures a top part of the frame 200. Of course, the top base 240 may configure a top part of an I/O port 100.

The frame 200 may include fixing terminals 210 and 220. The fixing terminals 210 and 220 may play a role in fixing the frame 200 to a PCB.

In particular, the fixing terminals 210 and 220 are preferably formed as soon as the top base 240 is bent in two ways. Namely, it is preferable that a separate bending process is not performed to form the fixing terminals. Hence, it is able to omit a bending process for forming fixing terminals.

Sidewalls 250 are formed at both sides of the top base 240, respectively. In particular, the sidewalls 250 are formed in a manner of bending the top base 240 in two ways. Hence, both of the sidewalls 250 and the fixing terminals 210 and 220 can be simultaneously formed by this bending process.

Preferably, the fixing terminals 210 and 220 are formed in a manner of being vertically bent from the top base 240. More preferably, the fixing terminals 210 and 220 are formed in a manner of extending over a bottom base 260. Hence, the fixing terminals 210 and 220 can configure the sidewalls 250 in part and may further extend downward to form the lowest end of the frame.

One pair of the fixing terminals 210 and another paid of the fixing terminals 220 may be provided to both sides of the frame 200, respectively. Hence, the frame 200 may be fixed to the PCB basically using total 4 fixing terminals.

Meanwhile, each of the fixing terminals 210 and 220 is fixed to the PCB by being inserted into an insertion hole (not shown in the drawings) formed in the PCB. Thereafter, the fixing terminals 210 and 220 are fully fixed to the PCB by soldering. In this case, the soldering may be a process performed between the PCB and the fixing terminal to fix them to each other.

Preferably, an embossing 211 is formed at the fixing terminal. In particular, the embossing 211 may be formed in a length direction of the corresponding fixing terminal 210. Through the embossing 21, it may be possible to extend a surface soldered between the fixing terminal and the PCB.

Meanwhile, as mentioned in the foregoing description, the fixing terminals 210 and 220 can be simultaneously formed by the bending for forming the sidewalls 250. And, the fixing terminals 210 and 220 can be formed by being directly bent from the top base 240. This may mean that a bent length is relatively long. This structural reason facilitates the bending and the job of increasing a width of each of the fixing terminals 210 and 220.

Owing to the embossing 211 and each of the fixing terminals 210 and 220 having the increased width, the soldered surface can be further increased. Hence, the frame 200 can be further solidly fixed to the PCB. In other words, the coupling power in-between is further increased to raise the force to breaking the coupling between the PCB and the frame 200.

A pair of the fixing terminals 210 and 220 can be provided to one lateral side and the embossing 211 may be formed at the fixing terminal 210 located in the vicinity of a front side only. Optionally, the embossing can be provided to each of the fixing terminals 210 and 220 as well.

Meanwhile, positions and shapes of the fixing terminals 210 and 220 play very important roles in reinforcing the coupling power with the PCB and the resistance power against an external force applied via the plug. This is because the external force applied via the plug needs to be evenly distributed to avoid having the external force concentrated on a specific position or location.

Therefore, the fixing terminals 210 and 220 preferably form the most outer wall of the frame 200. And, bending lines are configured between the fixing terminal and the top base, or between the sidewall and the top base. The bending lines for forming the fixing terminals 210 and 220 or the sidewalls 250 are set to be matched with an insertion direction of the plug. This means that a width direction of the fixing terminal is matched with the insertion direction of the plug.

As the bending line and the insertion direction of the plug are matched with each other, it may be possible to further increase the resistance power against an external force generated from inserting or withdrawing the plug. Moreover, each of the fixing terminals 210 and 220 is set vertical to the z-axis. In particular, even if a z-directional external force is generated, it may be able to minimize a external force applied to the y-axis from the bending line (i.e., a corner between the top base and the sidewall). Therefore, it may be possible to reinforce the coupling power and the resistance power.

In the following description, the relations between the sidewalls 250 and the fixing terminals 210 and 220 are explained in detail.

First of all, each of the sidewalls 250 configures a lateral side of the frame. In particular, the sidewall 250 may include a vertical sidewall 253 vertical to the top frame 240 and inclining sidewalls 251 and 252. In this case, each of the inclining sidewalls 251 and 252 may be formed by inclining and extending from the vertical sidewall 253 toward an inside of the frame.

Figure 6:
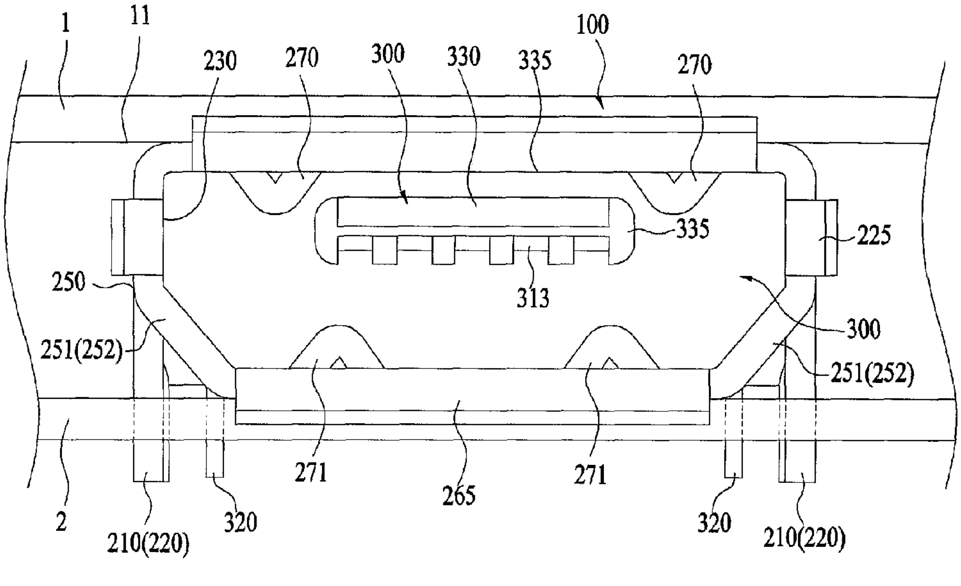
FIG. 6 is a front view diagram of an I/O port according to one embodiment of the present invention.

Referring to FIG. 6, a front opening 230 is provided to a front side of the frame to have the plug inserted therein. The front opening 230 has a top side and a bottom side configured to differ from each other in width due to the inclining sidewalls. In particular, the top side has a rectangular cross-section, while the bottom side has a cross-section of a lozenge shape. This shape of the sidewalls 250 is provided to prevent the plug from being inserted incorrectly.

The shape of the front opening 230 of the frame or the shape of the inclining sidewalls 251 and 252 may correspond to the shape of the plug. Therefore, it may be able to prevent the plug from being inserted upside down due to a shape difference.

Meanwhile, the inclining sidewalls 251 and 252 may be able to play a role in guiding the plug until the insertion of the plug is completed. Hence, it is preferable that the inclining sidewalls are provided to a plurality of spots to enable the plug to be fully inserted without shaking or rolling.

Figure 4:
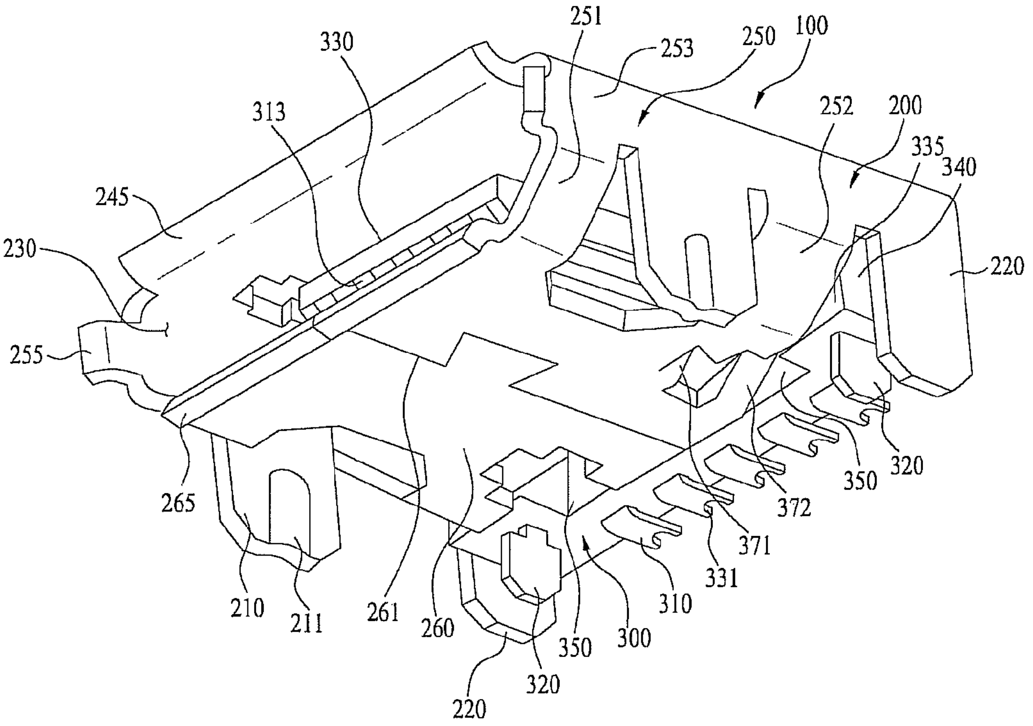
FIG. 4 is a perspective diagram of an I/O port according to one embodiment of the present invention.

In particular, referring to FIG. 4, the inclining sidewalls may include a front inclining sidewall 251 and a rear inclining sidewall 252 spaced apart from each other in a prescribed distance in accordance with a direction of inserting the plug. The front inclining sidewall 251 enables the plug to be correctly inserted in an early stage, while the rear inclining sidewall 252 enables the plug to be fully inserted without shaking or rolling.

The fixing terminal may be formed between the front inclining sidewall 251 and the rear inclining sidewall 252 and may be named a center fixing terminal 210. And, another fixing terminal can be formed in rear of the rear inclining sidewall 252 and may be named a rear fixing terminal 220.

The rear fixing terminal 220 may be preferably formed at a most rear end of the sidewalls 250 of the frame. And, the rear fixing terminal 200 may form the most rear end of the frame. Owing to the position relation between the center fixing terminal 210 and the rear fixing terminal 220, the frame can be fixed to the PCB more solidly.

Figure 5:
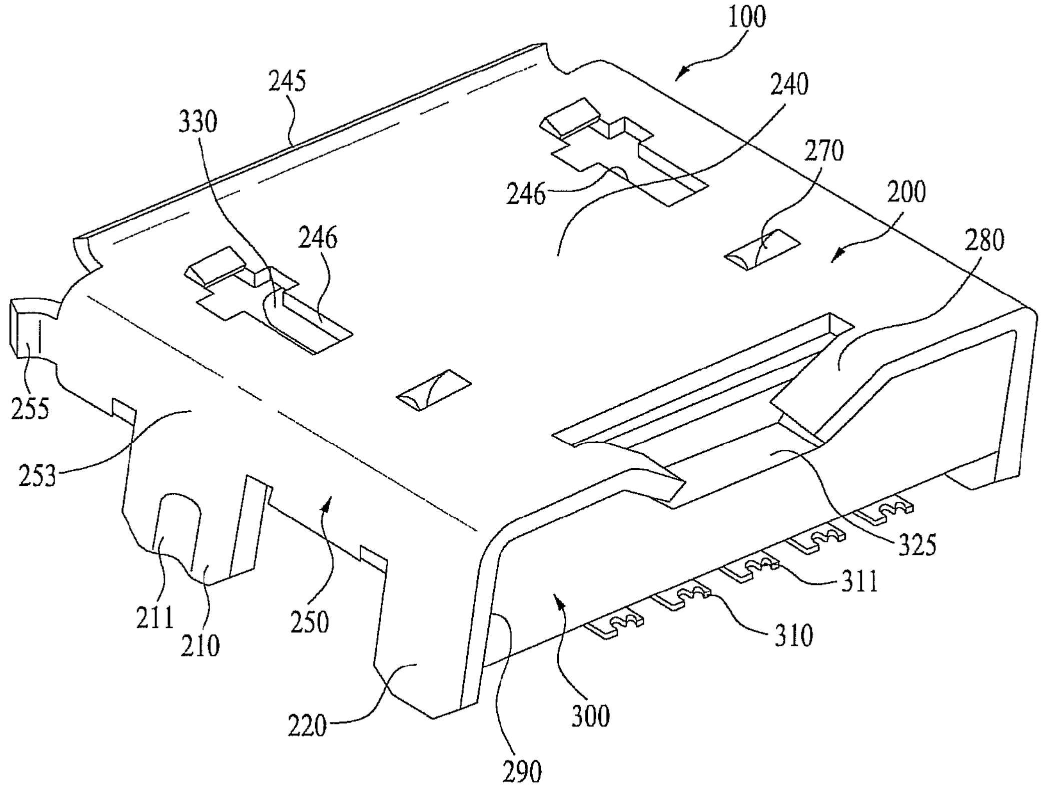
FIG. 5 is a perspective diagram of an I/O port according to one embodiment of the present invention in another view.

Meanwhile, the center fixing terminal 210 and the rear fixing terminal 220 are preferably set to configure the same plane, as shown in FIG. 4 and FIG. 5, at one side of the frame. Therefore, an external force applied to the frame can be evenly distributed to the fixing terminals 210 and 220.

In the following description, the mold part configuration and the coupling relation between the mold part and the frame are explained in detail with reference to the accompanying drawings.

First of all, as mentioned in the foregoing description, an I/O port 100 may include a frame 200 and a mold part 300. A plug is substantially coupled with the mold part 300. Hence, the frame 200 may be configured to protect the mold part 300, whereby the mold part 300 can be solidly coupled with a PCB.

In particular, the mold part 300 may be substantially provided within the frame 200. And, the mold part includes a lead terminal 310 to form a contact point with the plug and a contact point with the PCB. Generally, a plurality of lead terminals 310 are provided. And, a width of each lead terminal, the number of lead terminals and a position of each lead terminal may vary in accordance with an I/O port or plug type.

Figure 7:
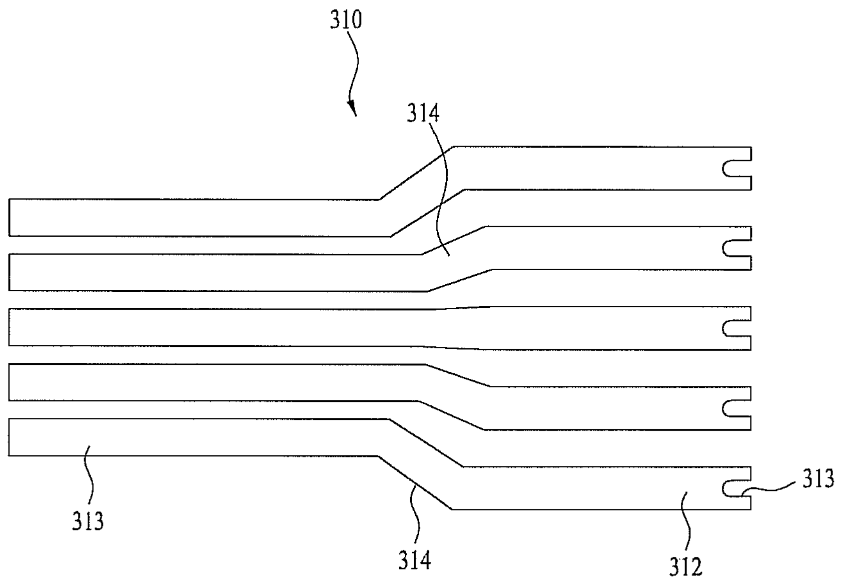
FIG. 7 is a schematic diagram of a pattern of lead terminals of an I/O port according to one embodiment of the present invention.

FIG. 7 shows a pattern of lead terminals of an I/O port according to one embodiment of the present invention.

Figure 3:
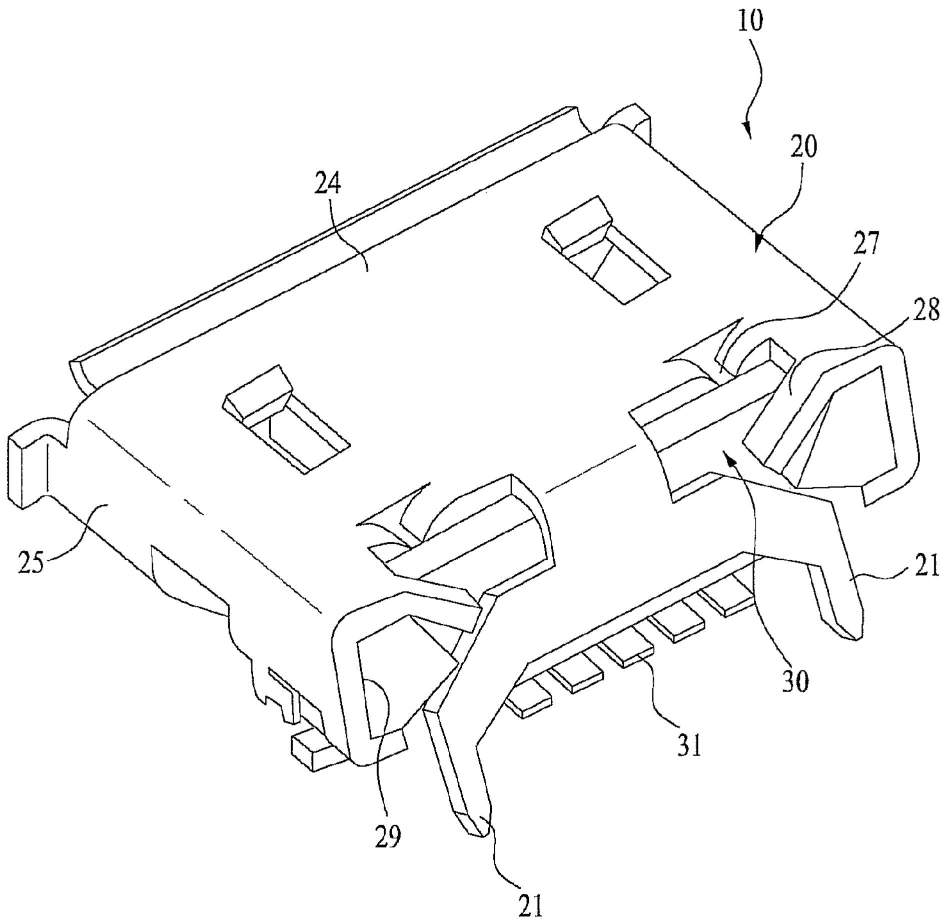
Fig. 3 Prior Art
FIG. 3 is a perspective diagram of the I/O port shown in FIG. 1 in another view.

Referring to FIG. 7, regarding a relation with a plug, a width of each of a plurality of lead terminals 310 is constant and a plurality of the lead terminals 310 are spaced apart from one another in a predetermined distance. In particular, a shape of a front lead terminal 313 situated at a front side among the lead terminals 310 shown in FIG. 3 may be a general shape.

For instance, in case of a micro-type USB I/O port, a width of the front lead terminal 313 may be set to 0.4 mm. This lead terminal pattern may be preferably changed for the present embodiment.

In particular, although a pattern of the front lead terminal 313 may have the same pattern of a conventional lead terminal in association with a relation with a plug, a pattern of a rear read terminal 312 may be preferably different from that of the conventional lead terminal.

A width of the rear lead terminal 312 may be preferably set greater than that of the front lead terminal 313. To this end, a terminal extension portion 314 may be formed between the front lead terminal 313 and the rear lead terminal 312. This terminal extension portion 314 may be provided to extend a distance between the lead terminals.

A pattern of the rear lead terminal 312 can be set equal to that of the front lead terminal 313 and a width of the rear lead terminal 312 can be increased only. If so, it may cause a short circuit between terminals and a soldering area between terminals may be considerably reduced. Hence, in the rear lead terminal 312, a distance between terminals is further increased as well as a width of a terminal. To this end, the terminal extension portion 314 can be provided.

As mentioned in the foregoing description, the terminal extension portion 314 enables an inter-terminal distance to be increased and also enables a width of the terminal. Through the terminal extension portions 314, the rear lead terminals 312 can be positioned in parallel with each other.

Referring to FIG. 7, it can be observed that a terminal width in the front lead terminal 313 is much greater than that of the rear lead terminal 312 and that an inter-terminal distance in the front lead terminal 313 is much greater than that of the rear lead terminal 312. Since the lead terminal 310, and more particularly, the rear lead terminal 312 is coupled with the PCB by soldering and forms a contact point with the PCB, the features of this structure and configuration may be very useful.

In particular, if the terminal width is increased, the soldering area between the lead terminal 310 and the PCB can be increased. Moreover, if the inter-terminal distance is increased, the soldering area can be further increased by minimizing influence on the short circuit between terminals.

Meanwhile, a recess 331 may be formed at the tip of the read lead terminal 312. This recess 331 can further increase a soldered surface area.

Therefore, through the aforementioned features of the lead terminal 310, it may be able to further enhance the coupling power between the lead terminal 310 and the PCB. The lead terminal 310 is built in one body of the mold part 300 and the mold part 300 is coupled with the frame 200. Therefore, the reinforcement of the coupling power between the lead terminal 310 and the PCB means the reinforcement of the coupling power between the frame 200 and the PCB, which eventually means the reinforcement of the coupling power between the I/O terminal and the PCB.

The mold part 300 may be formed of an insulating material. For instance, the mold part 300 is formed of a plastic based material. Thus, the mold part 300 plays a role in insulating the frame 200 and the lead terminal 310 from each other and also plays a role in fixing a position of the lead terminal 310.

The mold part 300 may be built in one body of the lead terminal 310. Hence, the mold part 300 may be configured by including the lead terminal 310. In particular, the lead terminal 310 may be built in one body of the mold part 300 by insert molding.

The mold part 300 may include a front mold part 330 and a rear mold part 340. In particular, the front mold part 330 may be a part to form a contact point with a plug and the rear mold part 340 may be a part to be coupled with the frame 200.

Referring to FIG. 4 and FIG. 6, the front mold part 330 is situated between the top frame 240 and the bottom frame 260 and is provided to a front side of the mold part 300. Hence, a contact point between a plug and a lead terminal may be formed at the front mold part 330. To this end, the front mold part 330 is situated within the frame 200 by being spaced apart from the frame 240 in a prescribed distance.

The rear mold part 340 is situated in rear of the front mold part 330 and may be tightly fixed to the frame 200. In particular, the rear mold part 330 may closely adhere between the top frame 240 and the bottom frame 260. And, the rear mold part 330 may tightly adhere between both of the sidewalls 250. Hence, the rear mold part 340 may be the configuration to fix the mold part 300 to the frame 200.

The rear lead terminal 312 is provided to the rear mold part 340. Hence, the mold part 300 may be fixed to the PCB via the rear lead terminal 312.

In this case, it may be preferable that a structure for coupling the mold part 300 with the frame 240 more solidly and a structure for restricting a distance for inserting a plug are provided. In particular, it may be necessary to provide a structure for preventing the mold part 300 from being separated via the front opening 230 or the rear opening 290 of the frame. And, it may be also necessary to provide a structure for restricting a plug inserted distance and preventing a considerable external force from being delivered to the mold part 300 via the plug.

Referring to FIG. 6, thickness of the front mold part is smaller than that of the rear mold part 340. Hence, a step sill 335 is formed between the front mold part 330 and the rear mold part 340. In this case, the step sill 335 may be continuously formed along a circumference of the mold part 300.

First of all, referring to FIG. 5, a stopper 270 for sliding prevention of the mold part and an inserted distance restriction of the plug may be formed at the top frame 240. The stopper 270 is configured to extend into the frame 200. And, the stopper 270 may be formed by a notching processing.

The stopper 270 may be formed in front of the rear mold part 340. Hence, the stopper 270 may be able to prevent the mold part 30 from being separated via the front opening 230 of the frame 200.

In particular, the stopper 270 may be provided to a position corresponding to the step sill 335 of the mold part 300. In more particular, the stopper 270 and the step sill 335 may be configured to come into contact with each other. Through this configuration, the coupling power between the frame 200 and the mold part 300 can be reinforced.

To correspond to the stopper 270, a stopper 271 may be formed at the bottom frame 260 as well. These stoppers may have the same shapes, forming methods and position relations with the mold part 300.

Yet, referring to FIG. 6, a relative position of the stopper 270 formed at the top frame 240 (i.e., a top stopper 270) is preferable different from that of the stopper 271 formed at the bottom frame 260 (i.e., a bottom stopper 271).

In particular, the top stopper 270 and the bottom stopper 271 may be formed to both sides of the frame 200, respectively. Yet, a distance between the top stoppers 270 is preferable different from that between the bottom stoppers 271/ Hence, it may be able to strengthen the resistance power against an external force applied to top and bottom sides of the mold part 300 and it may be able to strengthen the resistance power against an external force inclining to one side. Using the stoppers 270 and 271, it may be able to increase the coupling power between the mold part 300 and the frame 200.

Meanwhile, the stoppers 270 and 271 may be able to play a role in restricting a distance for inserting a plug. As the plug may be inserted in a manner of sliding via the front opening 230 of the frame 200, no considerable force is applied on insertion. Yet, if the insertion distance is not restricted after completion of the insertion, a considerable force is applied to the I/O port 100 via the plug.

In particular, if this considerable force is applied to the mold part 300, it may cause damage to the mold part 300, contact point damage and the like due to the material, configuration and structural features of the mold part 300. Hence, it may be necessary to prevent an external force to be directly delivered to the mold part 300 via a plug. This may be as good as restricting the insertion distance of the plug. This is because a structure for restricting the insertion distance may be formed not at the mold part 300 but at the frame 200.

As mentioned in the foregoing description, the stoppers 270 and 271 may be provided as the configuration for restricting the plug insertion distance. In particular, if a plug is inserted, a most fore portion of the plug comes into contact with the stoppers 270 and 271. Hence, the plug stops being inserted and an external force via the plug is directly delivered to the frame 200. Moreover, since the stoppers 270 and 271 are provided to top, bottom, right and left sides of the frame 200, they can distribute the external force via the plug to the frame 200 evenly.

Apart from the configuration of the stoppers 270 and 271 or the configuration of the step sill 335 of the mold part 300, it may be able to provide a structure for fixing the mold part 300 separately or combinably.

In particular, referring to FIG. 4, a recess 350 may be formed at a bottom side of the rear mold part 340. And a configuration counter to the recess 350 may be formed at the bottom frame 260. In particular, this configuration may include an insertion rib 272 formed by being bent upward from the bottom frame 260.

The insertion rib 272 may be inserted in the recess 350, whereby the mold part 300 can be prevented from being separated forward or backward.

Referring to FIG. 5, it may be able to provide a configuration for preventing the mold part 300 from being separated via the rear opening 290 of the frame 200.

In particular, a loading portion 325 is formed at the rear mold part 340 and a fixing rib 380 is formed at the rear opening 290 as a counter configuration. In this case, the fixing rib 380 may be formed in a manner of bending a portion of the top frame 240 downward.

Therefore, since the fixing rib 380 is loaded in the loading portion 325, the mold part 300 can be prevented from being separated via the rear opening 290.

Meanwhile, in order to be fixed to the PCB, the mold part 300 may include a mold part fixing terminal 320 as well as the lead terminal 300. In this case, the mold part fixing terminal 320 may be formed in a manner of extending from a bottom of the both rear side of the mold part 340 downward.

In particular, the mold part fixing terminal 320 is preferably provided in parallel with the aforementioned fixing terminals 210 and 220. In more particular, a width direction of the mold part fixing terminal 320 is set to coincide with an insertion direction of a plug. Therefore, the mold part 300 can be coupled with the PCB via the mold part fixing terminal 320 more solidly. So to speak, the frame or the I/O port can be assembled to the PCB more solidly.

The mold part fixing terminal 320 may be built in one body of the mold part 300. Alternatively, the mold part fixing terminal 320 is separately formed and may be coupled by being inserted in a slot (not shown in the drawing) formed at the mold part 300.

Therefore, using the aforementioned fixing terminals 210 and 220 and the mold part fixing terminal 320, the I/O port 100 can be fixed to the PCB more solidly.

In the following description, unmentioned components or configurations shown in FIGS. 4 to 6 are explained in detail.

Referring to FIG. 4, extending portions 245, 255 and 265 are formed at the front opening 230 of the frame 200. The extending portions 245, 255 and 265 extend an entrance of the front opening 230 to further facilitate a plug to enter the front opening 230. In particular, the extending portions 245, 255 and 265 may include the top extending portion 245 formed by bending a front end of the top frame 240 upward and the bottom extending portion 265 formed by bending a front end of the bottom frame 260 downward and may further include the lateral extending portion 255 formed by bending a front end of each of sidewalls outwardly.

Referring to FIG. 5, a perforating hole 330 may be formed at each of both sides of the top frame 240.

The perforating hole 330 may be provided to form a reference point in forming the frame 200. And, the perforating hole 330 may be formed to correspond to an inner structure of the housing (cf. reference number 1 shown in FIG. 1).

Referring to FIG. 6, according to the above-described embodiment of the present invention, the configuration for directly fixing the frame to the PCB includes the fixing terminals 210 and 220. In particular, the frame is directly fixed to the PCB via the fixing terminals only. This means that the bracket shown in FIG. 1 can be omitted. Therefore, the frame 200, and more particularly, the top frame 240 is preferably configured to directly come in contact with an inner surface of the housing 1.

Figure 1:
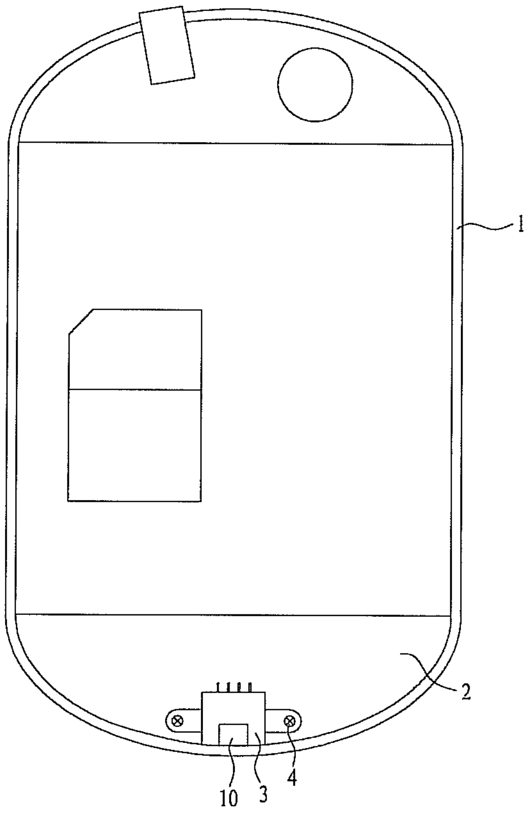
Fig. 1 Prior Art
FIG. 1 is a layout of an I/O port coupled with a portable device according to a related art.

Thus, the configuration counter to the perforating hole 246 is preferably formed at the inner surface of the housing 1. In particular, FIG. 1 shows that the bottom housing is removed. Hence, the perforating hole 246 is preferably configured to directly come in contact with the inner surface of the housing not shown in the drawing.

In the following description, a method of manufacturing a frame, an I/O port and a portable device according to an embodiment of the present invention is explained in detail with reference to FIG. 4.

First of all, a frame manufacturing method is described as follows.

The frame 200 may be formed by performing a sheet metal working on a plate parental material. In this case, the sheet metal working may include various kinds of working on forming a desired product by processing a plate parental material.

If a single frame 200 is formed using a single plate parental material, it may be not economical. Preferably, a plurality of frames 200 are formed using a single plate parental material.

In particular, in order to from the frame 200 shown in FIG. 4, positions, as which the details for configuring the frame 200 will be formed, are imprinted on a parental material. In this case, 'imprint' means that forming a basic framework of a frame rather than illustrating. For instance, the 'imprint' means that a cutting or a notching is performed to form partial configuration on a plate parental material.

In particular, a processing step of imprinting the top base 250, the bottom base 260, the sidewalls 250 at both sides, the fixing terminals 210 and 220, the support rib 280, the insertion rib 272, the stoppers 270 and 271 and the like on the parental material is performed. In order to form these configurations, the corresponding processing steps can include multiple steps. In particular, this job can be done by a notching processing.

In more particular, a part to be cut can be cut by the notching processing or the corresponding cutting can be facilitated by the notching processing. And, the configuration of the opening extension portions 245, 255 and 265 and the like can be formed by the notching processing. And, the embossing 211 of the fixing terminal can be formed by this step. So to speak, it may be able to perform the processing step of forming a development figure of the frame by processing the parental material.

Through this notching processing step, parts for forming the configurations of the frame are determined to facilitate the next process or steps.

Hereafter, it may be able to perform a bending processing step of forming both sidewalls by bending both sides of the top base 250. In doing so, the fixing terminals 210 can be formed as soon as the bending processing is performed. In particular, the fixing terminals 210 and 220 can be formed to configure portions of the sidewalls 250. This may be named a primary bending processing step.

As the fixing terminals 210 and 220 are formed by the primary bending processing step for forming the sidewalls, it may be effectively able to omit a separate bending processing step of forming the fixing terminals.

Subsequently, it may be able to perform a secondary bending processing step of forming the bottom base 260 by bending one of the sidewalls 250 at both sides or both of the sidewalls 250.

FIG. 4 shows one example of forming the bottom base 260 by bending both of the sidewalls 250. In particular, as a contacting structure 261 is formed at a central part of the bottom base 260, if the bending is completed, the bottom base 260 may be formed through this structure.

This structure 261 may include one of a jagged structure, a zigzagged structure and the like. In particular, the structure 261 may have a male-female structure.

Alternatively, the bottom base 260 may be formed overall in a manner of bending one of the sidewalls 250 at both sides. In this case, one side of the top base 260 should be coupled with the other sidewall 250. In particular, one side of the bottom base 260 is bent inward the opposite inclining sidewalls 251 and 252 and then locked [not shown in the drawing in detail]. Although the bottom base 260 tends to return to its original posture due to elastic force, the corresponding return may be restricted by the sidewall 250.

Therefore, the bottom base 260 can be formed overall by being bent from one of the sidewalls 250.

Through the aforementioned processing steps, the frame 200 may be formed almost. Yet, since a plurality of frames 200 can be produced from a single parental material, it may be necessary to perform a process for separating a plurality of the frames 200 from the parental material one by one. In particular, it may be necessary to separate a plurality of the frames 200 by cutting the connecting portion between the parental material and each of a plurality of the frames 200 by a blanking processing.

A plurality of the frames 200 may be produced from a single parental material. To this end, an appropriate die can be formed and a plurality of frames can be produced using a single die. In doing so, positions of frames in the die and possibility in fixing to the corresponding position may be important. Hence, a piercing processing may be performed in the first place to make frames. In particular, it may be able to perform a piercing processing for forming a reference point of each of the frames.

As mentioned in the foregoing description, the reference point of each of the frames can include the top locking hole 330 or another configuration of the frame. Of course, the reference point may be formed at a specific portion of the parental material failing to configure the frame, i.e., a portion thrown away as a scrap.

As the I/O port 100 of the portable device according to the embodiment of the present invention includes the frame and the mold part 300 provided within the frame, a method of manufacturing the I/O port 100 through the coupling between the frame and the mold part 300 should be taken into consideration.

First of all, the method of manufacturing the I/O port 100 can be performed by double insert molding. In particular, after a shape of the frame 200 has been prepared by the aforementioned steps, the lead terminal 310 can be situated at an appropriate position within the frame 200. Hence, after the frame 200 and the lead terminal 310 have been situated double within a molding die, it may be able to manufacture the I/O port 100 by molding. If so, the coupling between the frame 200 and the molding part 300 can become further solid.

After the frame 200 has been formed, the frame 200 and the mold part 300 can be coupled with each other in a manner if inserting the mold part 300 into the front opening 230 or the rear opening 290 of the frame 200. Yet, in doing so, after the mold part 300 has been inserted, a separate process may be necessary to form the coupling structure of the mold part 300.

For instance, after the mold part 300 has been inserted into the rear opening 290 of the frame 200, it may be possible to couple the frame 200 and the mold part 30 together by bending the support rib 280 and the insertion rib 272.

Alternatively, after the mold part 300 has been situated within the frame 200 after completion of the aforementioned primary bending processing step, it may be able to simultaneously couple the frame 200 and the mold part 30 with each other. Thus, the method of coupling the frame 200 and the mold part 300 can be modified in various ways.

By the above-described manufacturing method, the frame 200 or the I/O port 100 can be made. And, the I/O port 100 may be usable for a portable device.

The portable device may include the housing 1, the PCB 3 provided within the housing 1 and the I/O port, as shown in FIG. 1.

According to the present embodiment, the bracket configuration 3 and 4 shown in FIG. 1 can be omitted. This is because a sufficient coupling power can be provided between the PCB and the I/O port despite omitting the bracket configuration.

According to the present embodiment, the I/O port 100 is fixed to the PCB 3 in the first place. Subsequently, soldering can be performed on the fixing terminals 210 and 220 of the frame 200, the lead terminal 310 of the mold part 300 and the fixing terminal 330 (if necessary) of the mold part 300. The features of the above-described configurations further increase the soldering area, thereby increasing the coupling power between the I/O port 100 and the PCB.

After completion of the installation of the I/O port 100, a housing assembly of the portable device can be completed by omitting the separate installation of the bracket. Therefore, the number of parts (components) of the portable device is decreased and the assembly process can be simplified.

Meanwhile, the aforementioned preferred embodiment is applicable to various I/O ports of a portable device. For example of the aforementioned embodiment, a micro-type USB I/O port is described, by which the present invention may be non-limited.

Besides, the rigidity enhancement of the I/O port according to the aforementioned embodiment can be verified through the following test.

Figure 2:
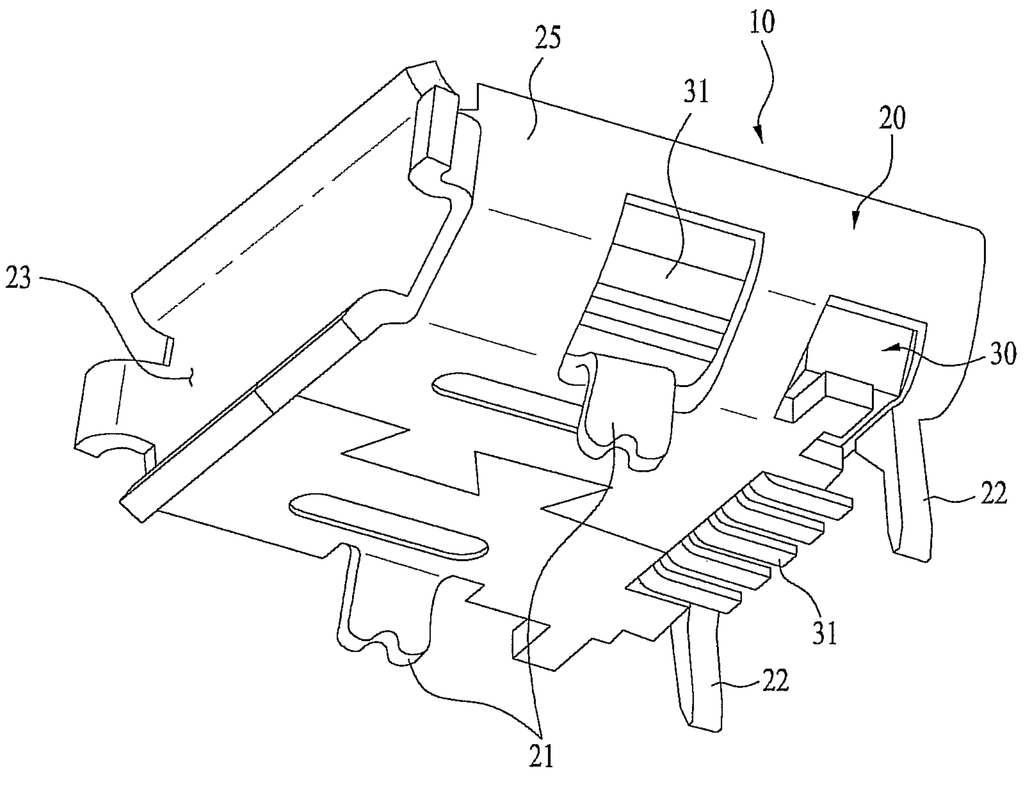
Fig. 2 Prior Art
FIG. 2 is a perspective diagram of the I/O port shown in FIG. 1.

First of all, according to the test, an I/O port is coupled with a PCB, a plug is inserted in the I/O port, a force in plus z-axis direction and a force in minus z-axis direction are then applied to the plug. This test is performed on an I/O port according to an embodiment of the present invention and a related art I/O port shown in FIGS. 1 to 3 to compare breaking strengths thereof.

Regarding an average of breaking strengths against the force in the plus z-axis direction (i.e., top direction) using 5 samples each, the I/O port of the present embodiment shows 20 Kgf all, while the related art I/O port shows 15.3 Kgf. Regarding an average of breaking strengths against the force in the minus z-axis direction (i.e., bottom direction) using 5 samples each, the I/O port of the present embodiment shows 20 Kgf all, while the related art I/O port shows 18.2 Kgf.

Therefore, through this test, it can be observed that the strength of the I/O port according to the present embodiment is considerably raised. In particular, it can be observed that the strength against the plus z-axis directional force is considerably raised.

This considerable effect is attributed to the features of the aforementioned embodiment, which play a role in increasing the breaking strength individually or combinably. Owing to this considerable effect, it may be able to delete the bracket configuration for reinforcing the rigidity of the I/O port.

According to an embodiment of the present invention, a portable device and an I/O port thereof can substantially obviate one or more problems due to limitations and disadvantages of the related art.

According to an embodiment of the present invention, a portable device can be provided, by which such performance of the portable device as wireless communication performance and the like can be enhanced in a manner of omitting a bracket configuration.

According to an embodiment of the present invention, a portable device and an I/O port thereof can be provided, by which the manufacture of the portable device and the I/O port thereof can be facilitated.

According to an embodiment of the present invention, a portable device and an I/O port thereof can be provided, by which a manufacturing cost can be reduced in a manner of decreasing the number of components and simplifying the manufacturing process.

According to an embodiment of the present invention, a portable device and an I/O port thereof can be provided, by which an economical portable device and an economical I/O port thereof can be provided in a manner of facilitating the manufacture of the I/O port and simplifying the manufacturing process.

According to an embodiment of the present invention, an I/O port of a portable device can be provided, by which a PCB can be coupled more solidly and reliably.

According to an embodiment of the present invention, an I/O port and portable device having the same an be provided, by which reliability and durability can be enhanced in a manner of preventing transformation or damage caused to a mold part of the I/O port.

According to an embodiment of the present invention, an I/O port and portable device having the same can be provided, by which an external force applied via a plug can be evenly distributed and by which the external force applied via the plug can be prevented from being directly delivered to a mold part of the I/O port to the maximum.

According to an embodiment of the present invention, an I/O port and portable device having the same can be provided, by which a mold part can be solidly fixed to a PCB in a manner of increasing a soldering area between a lead terminal and the PCB and providing a mold part fixing terminal.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A portable device comprising:
a housing;
a printed circuit board (PCB) provided within the housing; and
an input/output port having a frame to attach to the PCB, the input/output port to enable a plug to be inputted therein, the frame comprising:
a top base to form a top surface of the frame, the top base to contact an inner surface of the housing;
a pair of sidewalls bent from side ends of the top base to form two lateral sides of the frame,
a bottom base bent from a first plurality of bottom ends of the pair of sidewalls to form a bottom surface of the frame,
a plurality of fixing terminals to attach to the PCB, and
a front opening at a front of the frame to receive the plug therein,
wherein the plurality of fixing terminals are configured to be extended from a second plurality of the bottom ends of the sidewalls, and the plurality of fixing terminals are to be in alignment with the pair of sidewalls.

2. The portable device of claim 1, wherein the frame is directly attached to the PCB via only the fixing terminal, and wherein the top base of the frame contacts an inner surface of the housing.

3. The portable device of claim 1, wherein an embossing is provided at each of the fixing terminals.

4. The portable device of claim 1, wherein the input/output port includes a mold part provided within the frame, the mold part having a plurality of lead terminals in one body.

5. The portable device of claim 4, wherein a width of each of the plurality of the lead terminals gradually increases from a front of the lead terminals to a rear of the lead terminals.

6. The portable device of claim 5, wherein each of the plurality of the lead terminals has an extension portion provided to a middle portion of the corresponding lead terminal.

7. The portable device of claim 4, wherein each of the plurality of lead terminals includes a recess formed at a rear tip of the corresponding lead terminal.

8. The portable device of claim 4, wherein the frame includes a rear opening at a rear of the frame, and wherein a fixing rib is provided at the rear opening to attach the mold part.

9. The portable device of claim 4, wherein each of the top base of the frame and the bottom base of the frame includes at least one stopper for sliding prevention of the mold part or an inserted distance restriction of the plug.

10. The portable device of claim 4, wherein the mold part includes mold part fixing terminals to attach to the PCB by extending from both rear sides of the mold part, respectively.

11. The portable device of claim 4, wherein the mold part comprises:
a front mold part provided between a top part of the frame and a bottom part of the frame to form a contact point with the plug; and
a rear mold part provided to closely adhere to the top part of the frame and the bottom part of the frame to form a contact point with the PCB.

12. The portable device of claim 1, wherein the sidewalls include a vertical sidewall configured vertical to a top part of the frame and an inclining sidewall that extends from the vertical sidewall by inclining inward.

13. The portable device of claim 1, wherein the plurality of fixing terminals include:
a center fixing terminal provided in a middle of one of the sidewalls; and
a rear fixing terminal provided to a rear of each of the sidewalls.

14. A portable device comprising:
a housing;
a circuit board provided within the housing; and
an input/output port having a frame to attach to the circuit board and a mold part within the frame, the frame comprising:
a top base to form a top of the frame, the top base to contact an inner surface of the housing,
a pair of vertical sidewalls bent from side ends of the top base, the vertical sidewalls forming vertical lateral sides of the frame,
a pair of inclining sidewalls bent from bottom ends of the pair of vertical sidewalls, the inclining sidewalls forming inwardly inclined lateral sides of the frame,
a bottom base bent from a first plurality of bottom ends of the pair of inclining sidewalls, the bottom base to form a bottom surface of the frame,
a plurality of fixing terminals to directly attach to the circuit board, and
a front opening at a front of the frame,
wherein the plurality of fixing terminals are configured to be extended from a second plurality of the bottom ends of the vertical sidewalls, and the fixing terminals are to be in alignment with the pair of vertical sidewalls.

15. The portable device of claim 14, wherein the mold part includes a plurality of lead terminals within a body of the mold part, wherein a width of each of the plurality of the lead terminals gradually increases from a front of the lead terminal to a rear of the lead terminal.

16. The portable device of claim 15, wherein the mold part includes a mold part fixing terminal to couple to the circuit board.

17. The portable device of claim 14, wherein each of the lead terminals includes a recess formed at a rear of the corresponding lead terminal.

18. The portable device of claim 14, wherein the frame includes a rear opening at a rear of the frame, and wherein a fixing rib is provided at the rear opening to attach the mold part.

19. The portable device of claim 14, wherein each of the top base of the frame and the bottom base of the frame includes at least one stopper for sliding prevention of the mold part or an inserted distance restriction of the plug.

20. The portable device of claim 14, wherein the mold part comprises:
a front mold part between the top frame and the bottom frame to form a contact point with the plug; and
a rear mold part to closely adhere to the top frame and the bottom frame to form a contact point with the circuit board.

* * * * *